United States Patent
Wang

[11] Patent Number: 6,096,620
[45] Date of Patent: Aug. 1, 2000

[54] METHOD OF FABRICATING DYNAMIC RANDOM ACCESS MEMORY CAPACITOR

[75] Inventor: Chuan-Fu Wang, Taipei Hsien, Taiwan

[73] Assignee: United Microelectronics Corp., Taiwan

[21] Appl. No.: 09/191,490

[22] Filed: Nov. 13, 1998

[51] Int. Cl.⁷ .................................................. H01L 21/20
[52] U.S. Cl. ...................... 438/396; 438/254; 438/397; 438/398
[58] Field of Search ..................................... 438/171, 190, 438/238, 239, 240, 253, 254, 329, 396, 397, 398, 399, 618, 652, 761

[56] References Cited

U.S. PATENT DOCUMENTS

| | | | |
|---|---|---|---|
| 5,071,783 | 12/1991 | Taguchi et al. | 438/254 |
| 5,126,810 | 6/1992 | Gotou | 257/306 |
| 5,206,787 | 4/1993 | Fujioka | 25/307 |
| 5,817,553 | 10/1998 | Stengl et al. | 438/253 |
| 5,851,897 | 12/1998 | Wu | 438/397 |
| 5,904,537 | 5/1999 | Wu | 438/396 |
| 6,020,233 | 2/2000 | Kim | 438/240 |

OTHER PUBLICATIONS

Ema et al., "3–Dimensional Stacked Capacitor Cell for 16M and 64M Drams", International Electron Devices Meeting, Dec. 1988, pp. 592–595.

*Primary Examiner*—Carl Whitehead, Jr.
*Assistant Examiner*—Jamie L. Davis
*Attorney, Agent, or Firm*—Ratner & Prestia

[57] ABSTRACT

A method of fabricating a capacitor. Isolation layers and conductive layers are formed alternately on a dielectric layer on a substrate. The conductive layers and the isolation layers are patterned to form an opening to expose a conductive region of the substrate. A spacer is formed on the sidewall of the conductive layers and the isolation layers exposed by the opening. The spacer is used as a mask to form a contact hole. The conductive layer on the dielectric layer is used as an etching stop layer. The isolation layers and the conductive layers are patterned. A conductive layer is formed to cover the substrate to cover the isolation layers and the conductive layers and to fill the contact hole. A portion of the conductive layers is removed to expose the spacer. The spacer and isolation layers are removed to expose the storage electrode formed by the conductive layers. A dielectric film layer and a cell electrode are formed in sequence over the substrate.

19 Claims, 4 Drawing Sheets

METHOD OF FABRICATING DYNAMIC RANDOM ACCESS MEMORY CAPACITOR

BACKGROUND OF THE INVENTION

1. Field of Invention

The present invention relates to a semiconductor fabricating method. More particularly, the present invention relates to a method of fabricating a capacitor.

2. Description of Related Art

As the function of a microprocessor becomes more powerful, the program and calculation of software becomes more complicate, and thus the need for Dynamic Random Access Memory (DRAM) storage memory is increased. As the number of semiconductor devices incorporated in an integrated circuit increases, a memory cell, which comprises a transfer field effect transistor (TFET) and a storage capacitor, is widely used. In FIG. 1. a circuit diagram of a DRAM memory cell is shown. A capacitor C is used to store information as binary data by charging/discharging states. Normally, a binary bit is stored in each capacitor. When the capacitor C is free of charge, logic "0" is presented, whereas when the capacitor is fully charged, logic "1" is presented. In general, a dielectric film 101 is deposited between a top electrode (cell electrode) 102 and a bottom electrode (storage electrode) 100. The capacitor C is electrically coupled with a bit line BL. The read/write operation of a DRAM memory cell is performed by the charging/discharging states of the capacitor C. The bit line BL is connected to the drain of the transfer field effect transistor T. The capacitor C is connected to the source of the transfer field effect transistor T. A signal transmitted through a gate of the transfer field effect transistor T is used to control the capacitor C to turn on or turn off the connection with the bit line BL. In other words, the transfer field effect transistor T acts as a switch to control the charging or discharging state of the capacitor C.

In the DRAM manufacturing process, a two-dimensional capacitor named a planar type capacitor is mainly used for a conventional DRAM having a storage capacity less than 1M (mega=million) bits. In the case of a DRAM having a memory cell using a planar type capacitor, electric charges are stored on the electrode of a semiconductor substrate, and thus the electrode is required to have a large area. This type of memory cell is therefore not suitable to be used in a DRAM having a high degree of integration. For a high integration DRAM, such as a DRAM with more than 4M bits of memory, a three-dimensional capacitor, such as a stacked-type or a trench-type capacitor, has been introduced.

With stack-type or trench-type capacitors, it has been made possible to obtain a larger memory without increasing the volume. However, to realize a semiconductor device of an even higher degree of integration, such as a very-large-scale integration (VLSI) circuit having a capacity of 64M bits, a capacitor of such a simple three-dimensional structure as the conventional stacked-type or trench-type, turns out to be insufficient.

One solution for improving the capacitance of a capacitor is to use the fin-type stacked capacitor. The fin-type stacked capacitor includes electrodes and dielectric layers which extend in a fin shape in a plurality of stacked layers. Hence, the surface area of the electrode is enlarged, the capacitance is increased. Refer to Ema et al., "3-Dimensional Stacked Capacitor Cell for 16M and 64M DRAMs", International Electron Devices Meeting, pp. 592–595, December 1988, and the U.S. Pat. Nos. 5,071,783, 5,126,810, and 5,206,787.

Another solution for improving the capacitance of a capacitor is to use the cylindrical-type stacked capacitor. The cylindrical-type stacked capacitor includes electrodes and dielectric films which extend in a cylindrical shape to increase the surface areas of the electrodes. Refer to Wakamiya et al., Novel Stacked Capacitor Cell for 64-Mb DRAM, 1989 Symposium on VLSI Technology Digest of Technical Papers, pp. 69–70, and the U.S. Pat. No. 5,077,688.

With the trend toward high integration density, the size of the DRAM cell must be further reduced. Generally, a reduction in the size of the cell leads to a reduction in charge storage capacitance. Additionally, as the capacitance is reduced, the likelihood of soft errors arising from the incidence of $\alpha$-rays is increased.

SUMMARY OF THE INVENTION

Accordingly, the invention is to provide a fabricating method of a capacitor, of which the capacitance is maintained while the capacitor area occupied in a plane is decreased. Another purpose of the invention is to decrease the manufacturing costs, and increase process tolerance and product yield.

To achieve these and other advantages and in accordance with the purpose of the invention, as embodied and broadly described herein, the invention provides a method of fabricating a capacitor including the step of providing a substrate having a transistor thereon. A dielectric layer is formed on the substrate. Several conductive layers and isolation layers are formed alternatively over the dielectric layer. The several conductive layers and the isolation layers are patterned to form an opening over the source/drain region. A spacer is formed on the sidewall of the conductive layers and the isolation layers exposed by the opening. The top conductive layer of the stacked layer is used as a mask. The isolation layers, the conductive layers, and the dielectric layer are patterned to form a contact hole exposing the source/drain region. The conductive layer on the dielectric layer is used as an etching stop layer. The several isolation layers and the conductive layers are patterned. A conductive layer is formed over the substrate to cover the isolation layers and the conductive layers and fill the contact hole. The conductive layer is electrically coupled with the source/drain region. The top isolation layer is used as an etching stop layer to remove the conductive layer over it and expose the spacer. The spacer and isolation layers are removed to expose the storage electrode formed by the conductive layers. A dielectric film layer and a cell electrode are formed in sequence over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
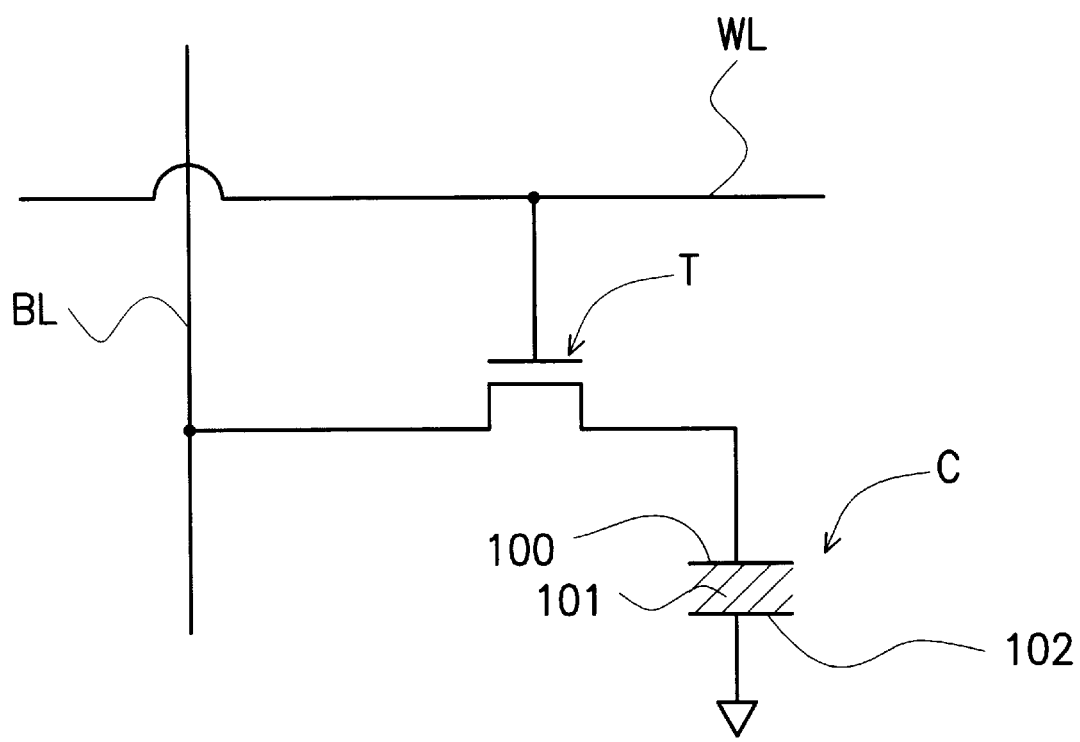
FIG. 1 is a circuit diagram of a conventional dynamic random memory cell (DRAM) memory cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing a DRAM capacitor fabricating process according to one preferred embodiment of the invention.

Figure 2A:
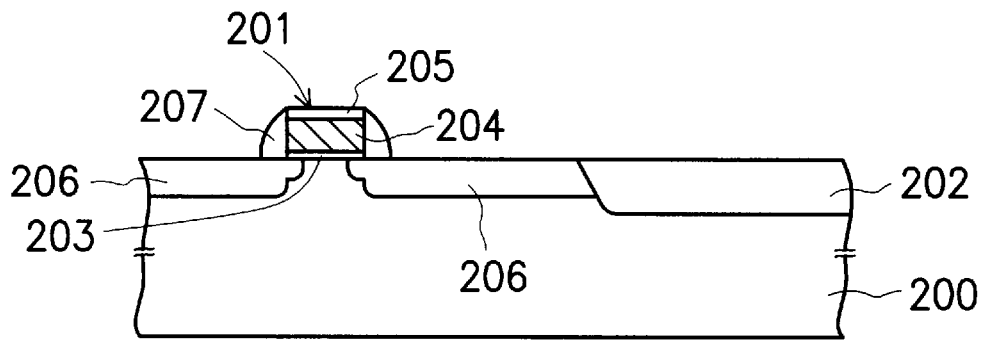
FIGS. 2A through 2F are cross-sectional views showing a DRAM capacitor fabricating process according to one preferred embodiment of the invention.

In FIG. 2A, a substrate 200 is provided. An isolation 202 is formed on the substrate 200. The isolation 202 is used to define an active region. The isolation 202 may be formed by, for example, local oxidation (LOCOS) or shallow trench isolation (STI). A field effect transistor 201 is formed on the active region of the substrate 200. The conventional method of forming the field effect transistor 201 includes the steps of forming a thin oxide layer (not shown) on the substrate 200 by hot oxidation method. A conductive layer (not shown) and an isolation layer (not shown) are formed in sequence on the thin oxide layer. The thin oxide layer, the conductive layer, and the isolation layer are patterned to form a gate oxide layer 203, a gate conductive layer 204, and a gate cap layer 205, and then the field effect transistor 201 is formed. The substrate 200 is doped to form a source/drain region 206 in the substrate 200. An isolation layer (not shown) is formed on the substrate 200. The isolation layer is etched back to form a spacer 207 on the sidewall of the gate oxide layer 203, the conductive gate layer 204, and the gate cap layer 205. The conductive gate layer 204 can be, for example, a doped polysilicon layer formed by chemical vapor deposition method. The material of the gate cap layer 205 and the spacer 207 can be, for example, silicon nitride. The gate cap layer 205 and the spacer 207 can be, for example, formed by using chemical vapor deposition method.

Figure 2B:
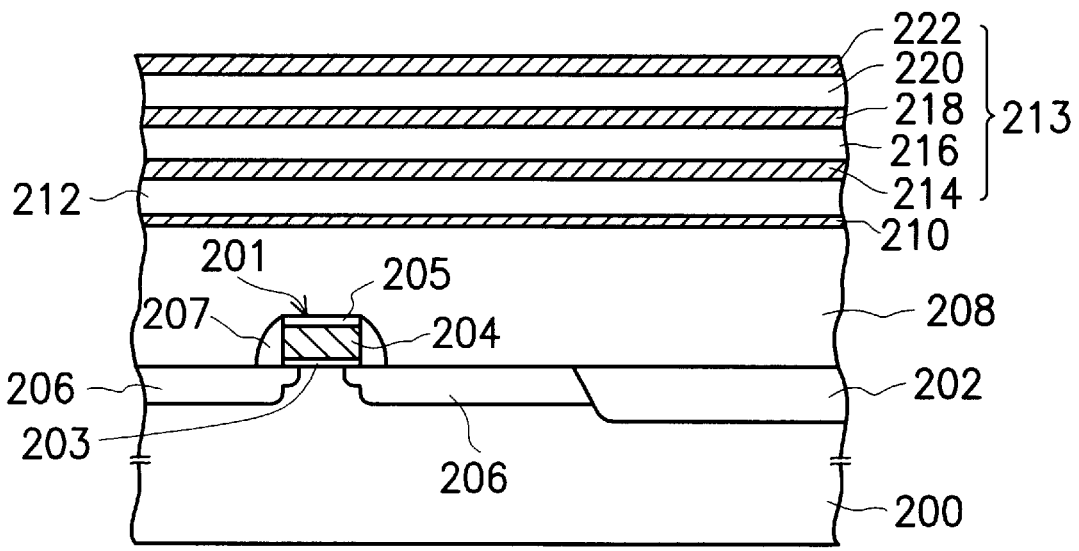

In FIG. 2B, a dielectric layer 208, a conductive layer 210, and an isolation layer 212 are formed in sequence over the substrate 200. Conductive layers and isolation layers are formed alternately over the substrate 200. The conductive layers 214, 218, and 222 and the isolation layers 216 and 220 are stacked to each other to form a stacked layer 213. The material of the dielectric layer 208 can be silicon oxide or borosphosilicate glass (BPSG), for example. The dielectric layer 208 can be formed by using chemical vapor deposition method, for example. The material of the conductive layers 210, 214, 218, and 222 can be doped polysilicon. The conductive layers 210, 214, 218, and 222 are formed by chemical vapor deposition method. While the substrate 200 is selected from a P-type substrate, the dopant, such as n-type ion, is doped while depositing the polysilicon layer to form the conductive layers 210, 214, 218, and 222. In contrast, while an N-type substrate 200 is in use, the conductive layers 210, 214, 218 and 222 are doped by P-type dopant. The electrical conductivity of the conductive layers 210, 214, 218, and 222 thus is increased. The conductive layer 222 of the stacked layer 213 has a thickness larger than the conductive layer 210 so as to act as an etching stop in the following step of forming a contact hole (shown in FIG. 2D). The etching rate of the isolation layers 212, 216, and 220 is different from the conductive layer 210, 214, 218, and 222. The isolation layer 212 includes a silicon oxide layer formed by using the low-pressure chemical vapor deposition (LPCVD) method. For example, tetra-ethyl-ortho-silicate (TEOS) is used as a reactant gas in LPCVD method to form TEOS silicon oxide isolation layers 212, 216, and 220. The number of the conductive layers and the insulation layers may be varied according to the specific requirements.

Figure 2C:
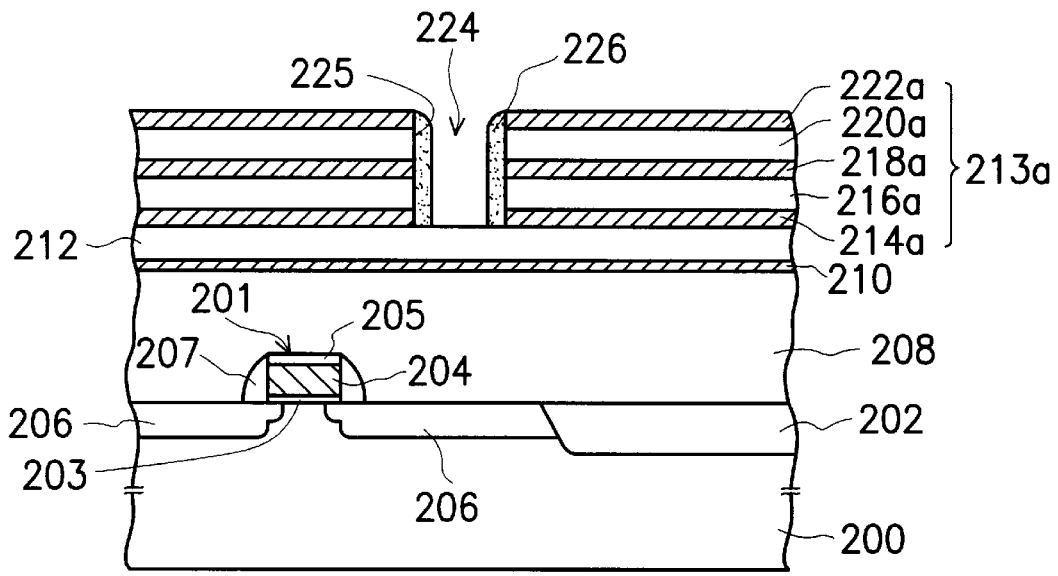

In FIG. 2C, the conductive layers 214, 218, and 222 and isolation layers 216 and 220 are patterned with the insulation layer 212 as an etch stop to form an opening 224 over the source/drain region 206. A spacer 226 is formed on the sidewall 225 of the stacked layer 213a exposed by the opening 224. The etching rate of the spacer 226 is different from the isolation layer 212, the conductive layer 210, and the dielectric layer 208. The material of the conductive layer 210 is doped polysilicon layer, a preferred material of the spacer 226 is silicon nitride, for example. The steps of forming the spacer 226 includes, for example, using the chemical vapor deposition method to deposit a silicon nitride layer (not shown) over the substrate. The silicon nitride layer is etched by anisotropic etching method, such as plasma etching method, to form the spacer 226 on the sidewall of the stacked layer 213a exposed by the opening 224.

Figure 2D:
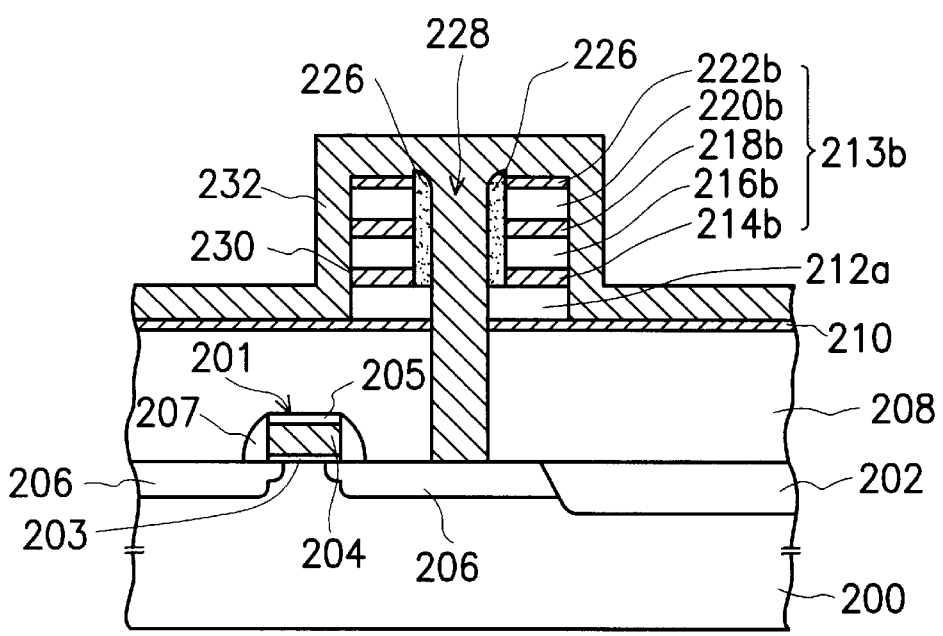

In FIG. 2D, the spacer 226 and the conductive layer 222a is used as mask. The isolation layer 212, the conductive layer 210, and the dielectric layer 208 are etched in sequence. A contact hole 228 exposing the source/drain region 206 is formed. The method of forming the contact hole 228 includes photolithography and anisotropic etching process, such as plasma etching method. The stacked layer 213a and the isolation layer 212 are patterned to expose the conductive layer 210 and denoted as 213b and 212a as shown in the figure. The patterned stacked layer 213a has a side wall denoted as 230. A conductive layer 232 is formed to cover the substrate 200 and to fill the contact hole 228 and is electrically coupled with the source/drain region 206. The conductive layer 232 can be a doped polysilicon layer formed by using chemical vapor deposition method, for example. While depositing the polysilicon layer, a dopant, such as n-type ion, may be doped in order to increase the electrical conductivity.

Figure 2E:
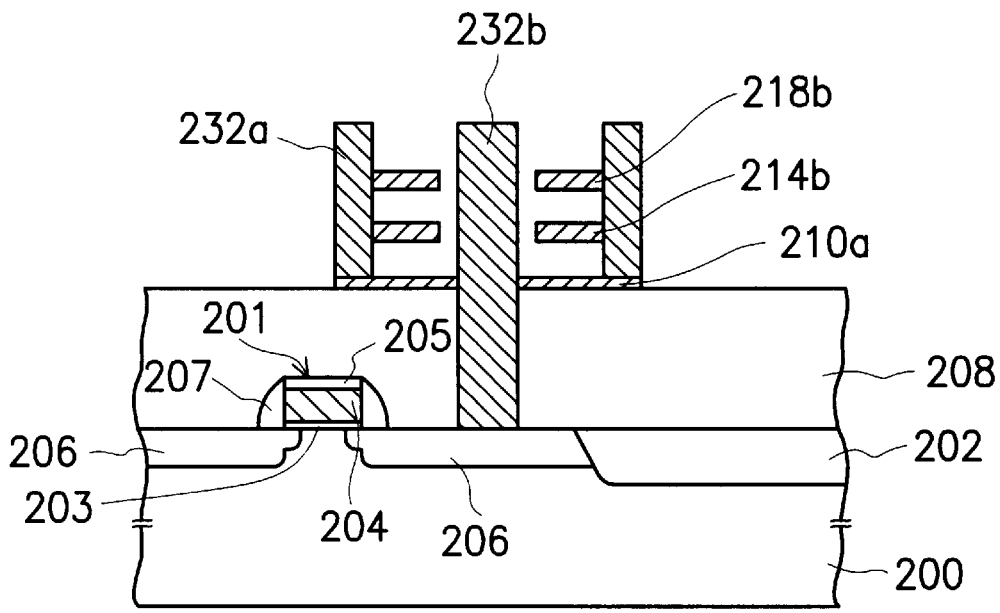

In FIG. 2E, the isolation layer 220b of the stacked layer 213b is used as an etching stop layer. The conductive layer 232, the conductive layer 222b and the conductive layer 210 are etched until the top of the spacer 226, the dielectric layer 208, and the isolation layer 220b are exposed. The spacer 226, the isolation layers 220b, 216b, and 212a are removed in sequence. The storage electrode formed from the conductive layers 210a, 214b, 218b, 232a and 232b is exposed. The method of removing the conductive layer 222b and the conductive layer 232 over the isolation layer 220b includes an anisotropic method, such as plasma dry etching method. The method of removing the spacer 226 and the isolation layers 220b, 216b, and 212a includes an anisotropic method and an isotropic method, such as a wet etching method. The remaining conductive layers 232b, 210a, 214b, 218b, and 232a are combined as a bottom electrode, that is, a storage electrode.

Figure 2F:
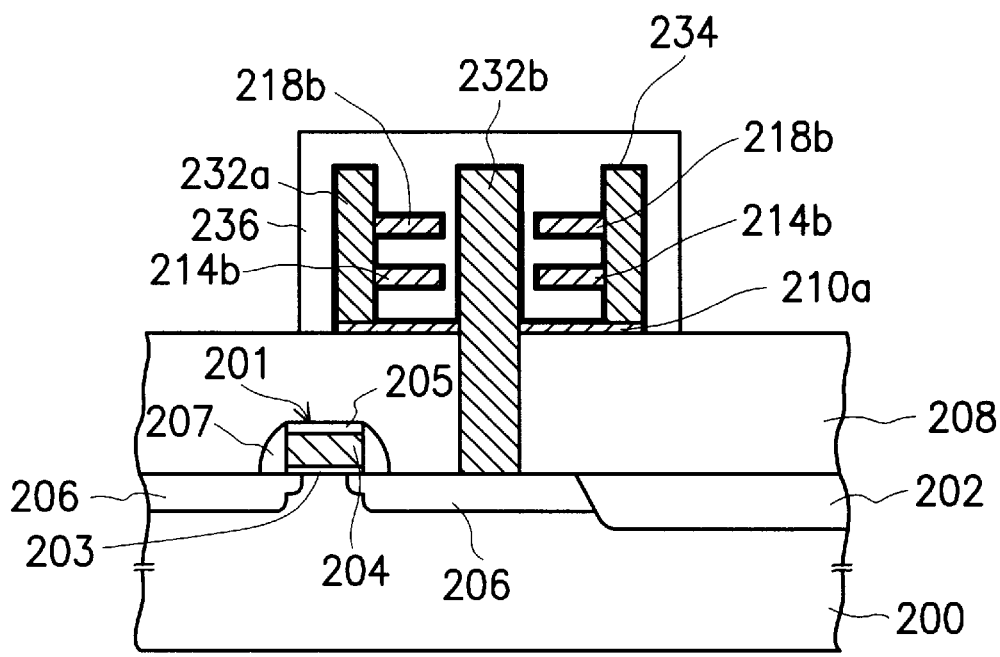

In FIG. 2F, a dielectric film layer 234 and a conductive layer 236 are formed in sequence to cover the bottom electrode. The conductive layer 236 is used as a top electrode, or called as a cell electrode. A capacitor is completed. The dielectric film layer 224 can be, for example, a silicon oxide layer, a silicon nitride/silicon oxide (NO) layer, a silicon oxide/silicon nitride/silicon oxide (ONO) layer, a $Ta_2O_5$ layer, a $Pb(Zr, Ti)O_3$ layer (PZT layer), a $(Ba, Sr)TiO_3$ layer (BST layer), or other layers with high dielectric constant. The conductive layer 236 can be, for example, a doped polysilicon layer by using a chemical vapor deposition method and doping at the same time.

In summary, one of the characteristics of the present invention is to from a storage electrode by using the different etching rates of the conductive layers and the isolation layers. The effective area of the storage electrode is enlarged in a limited area occupied in a plane. The present invention can be fabricated more easily, and thus the manufacturing cost is decreased, the process tolerance and the product yield are increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor to couple a conductive source/drain region on a substrate, comprising the steps of:

forming a first dielectric layer on the substrate;

forming a first conductive layer and a first isolation layer over the dielectric layer;

forming a stacked layer on the first isolation layer, the stacked layer comprising at least a second conductive layer, a second isolation layer and a third conductive layer;

patterning the stacked layer to form a opening aligned over the conductive region;

forming a spacer on a sidewall of the stacked layer exposed by the opening;

deepening the opening to form a contact hole expose the conductive source/drain region;

patterning the stacked layer and the first isolation layer to expose the third conductive layer and top portions of the first conductive layer;

forming a fourth conductive layer to cover the patterned stacked layer and the first isolation layer and the first conductive layer, and filling the contact hole to electrically coupled with the source/drain region;

etching the fourth conductive layer, the patterned third conductive layer, and the exposed top portions of the first conductive layer to expose a top portion of the spacer, the second isolation layer, and the dielectric layer;

removing the spacer, the second isolation layer, and the first isolation layer to expose a storage electrode formed by the remaining first, second and the fourth conductive layers; and forming a second dielectric layer and a fifth conductive layer in sequence to cover the storage electrode.

2. The method of claim 1, wherein the second conductive layer and the first isolation layer have different etching rates.

3. The method of claim 2, wherein the second conductive layer includes doped polysilicon and the first isolation layer includes silicon oxide.

4. The method of claim 1, wherein etching rates of the first, the second, the third conductive layers are different from those of the first, and the second isolation layers.

5. The method of claim 4, wherein the first, the second, and the third conductive layers include doped polysilicon.

6. The method of claim 4, wherein the first and the second isolation layers includes silicon oxide.

7. The method of claim 1, wherein the spacer has an etching rate different from that of the first isolation layer and the first conductive layer.

8. The method of claim 7, wherein the spacer includes silicon nitride.

9. The method of claim 1, wherein the fourth conductive layer includes doped polysilicon.

10. The method of claim 1, wherein the step of top portion of the fourth conductive layer and the third conductive layer includes a dry etching method.

11. The method of claim 1, wherein the step of removing the spacer, the first isolation layer, and the second isolation layer includes an isotropic etching method.

12. The method of claim 1, wherein the step of removing spacer, the first isolation layer, and the second isolation layer includes a wet etching method.

13. The method of claim 1, wherein the second dielectric layer includes a silicon oxide layer.

14. The method of claim 1, wherein the second dielectric layer includes a silicon nitride/silicon oxide (NO) layer.

15. The method of claim 1, wherein the second dielectric layer includes a silicon oxide/silicon nitride/silicon oxide (ONO) layer.

16. The method of claim 1, wherein the second dielectric layer includes a $Ta_2O_5$ layer.

17. The method of claim 1, wherein the fifth conductive layer includes doped polysilicon.

18. The method of claim 1, wherein the step of forming the stacked layer further comprises forming a sixth conductive layer and a third isolation layer between the second isolation layer and the third conductive layer.

19. The method of claim 1, wherein the step of forming the stacked layer further comprises forming several conductive layers and several isolation layers stacked to each other between the second isolation layer and the third conductive layer.

* * * * *